United States Patent
Zid et al.

(10) Patent No.: US 8,948,215 B2
(45) Date of Patent: Feb. 3, 2015

(54) HIGH SPEED AND HIGH JITTER TOLERANCE DISPATCHER

(75) Inventors: Mounir Zid, Ariana (TN); Alberto Scandurra, Messina (IT); Carmelo Pistritto, Catania (IT); Rached Tourki, Monastir, TN (US)

(73) Assignees: STMicroelectronics SA, Montrouge (FR); STMicroelectronics S.r.l., Agrate Brianza (MB) (IT)

( * ) Notice: Subject to any disclaimer, the term of this patent is extended or adjusted under 35 U.S.C. 154(b) by 241 days.

(21) Appl. No.: 13/449,473

(22) Filed: Apr. 18, 2012

(65) Prior Publication Data

US 2012/0269206 A1    Oct. 25, 2012

(30) Foreign Application Priority Data

Apr. 21, 2011   (EP) .................................. 11425111

(51) Int. Cl.
- *H04J 3/04* (2006.01)
- *G01R 31/08* (2006.01)
- *G11C 11/34* (2006.01)
- *H03M 9/00* (2006.01)

(52) U.S. Cl.
CPC ...................................... *H03M 9/00* (2013.01)
USPC .............................. 370/535; 370/248; 365/174

(58) Field of Classification Search
CPC ............. H03M 9/00; G11C 7/22; H04J 3/047
USPC ......................................................... 370/535
See application file for complete search history.

(56) References Cited

U.S. PATENT DOCUMENTS

| | | | |
|---|---|---|---|
| 7,898,991 B2* | 3/2011 | Cole | 370/271 |
| 2004/0086002 A1* | 5/2004 | Dally et al. | 370/539 |
| 2005/0231399 A1 | 10/2005 | Fowler et al. | |
| 2007/0291535 A1* | 12/2007 | Eberle et al. | 365/174 |
| 2008/0025450 A1* | 1/2008 | Alfano et al. | 375/362 |
| 2008/0068097 A1 | 3/2008 | Sung | |
| 2008/0169946 A1 | 7/2008 | Shin et al. | |

OTHER PUBLICATIONS

EPO Search Report and Written Opinion for EP 11425111.9 mailed Oct. 6, 2011 (8 pages).

* cited by examiner

*Primary Examiner* — Shaq Taha
(74) *Attorney, Agent, or Firm* — Gardere Wynne Sewell LLP

(57) ABSTRACT

A deserializer circuit includes demultiplexer circuitry configured to receive serial data from an input and output a plurality of divided data outputs, and multiplexer circuitry configured to receive a first logic level at a first input of said multiplexer circuitry, and receive a second logic level at a second input of said multiplexer circuitry and receive one of said divided data outputs at a control input of said multiplexer circuitry. The outputs of the multiplexer circuitry produce the received serial data in a parallel form.

22 Claims, 11 Drawing Sheets

HIGH SPEED AND HIGH JITTER TOLERANCE DISPATCHER

PRIORITY CLAIM

This application claims priority from European Application for Patent No. 11425111.9 filed Apr. 21, 2011, the disclosure of which is hereby incorporated by reference.

TECHNICAL FIELD

The present invention relates to an arrangement and in particular, but not exclusively, to a dispatcher.

BACKGROUND

A serial data stream may be made up with n channels of serial data. For example, n may be equal to $2^m$. Each of the n channels is of relatively low speed serial data whereas the serial data stream may be relatively high speed. Each of the n channels has the same data rate. FS is the rate of the bits of the high speed serial data stream whereas FL is the rate of bits of the individual channels. FS and FL are related by $FS=FL/n$.

The high speed serial data stream may need to be processed to regenerate the original channels. Various solutions have been proposed.

In a first flip-flop based dispatcher, the dispatcher uses n flip-flops synchronized with different clock signals operating at FL but delayed by $2\pi/n$ in phase from each other. The first technique requires a lot of control signals (n). The arrangement presents a high input load that increases with n and hence its input delay is relatively large. The area required to implement such an arrangement is relatively high and is also proportional to n. Given that the different flip-flops share the same data input, implementation of such an arrangement may be difficult because of the high wire routing complexity. The circuit is power hungry because of the utilization of flip-flops characterized by relatively high static power consumption. Further, the considerable timing constraints from the hold and setup times of the flip-flops make the arrangement sometimes unsuitable for dispatching high speed serial data streams and consequently it offers a low jitter tolerance.

A second technique uses a tree of 1:2 demultiplexing based flip-flops which form the de-multiplexer. The sampling is done in the middle of the pulse width. This may require phase delaying. The second technique has a serial data input to a first demultiplexer, the output of that multiplexer being input to further de-multiplexers. There are m levels of de-multiplexing until the n channels are separated.

The second technique tends to have high power consumption. In particular, the static power consumption is relatively high due to the number of flip-flops. The dynamic power consumption is also relatively high due to the high frequency control signals and also the number of flip-flops. Furthermore, the area required to implement such a technique tends to be large. In some arrangements, such a circuit may not be able to dispatch high speed serial data streams. Such an arrangement may also have a low jitter tolerance.

It has been proposed to have a combinatorial logic based dispatcher. This takes the incoming signal and provides an AND function on the incoming signal with a Boolean code to dispatch the data. Such an arrangement tends to have n AND gates with m+1 inputs and m inverters. The Boolean signals are m clocks operating at FS/m and are delayed from each other by $2\pi/m$ in phase. These signals can be produced by an incremental counter. Incrementing the counter can be done at the same time as the data changes and it is therefore held stable during one pulse width equal to 1/FS.

Such an arrangement may have a disadvantage that it has a high input load that increases with n. Consequently, the input delay of this arrangement is potentially high. Because of the shared inputs, there may be some routing complexity. Furthermore, some logical effort needs to be applied to design considerations. Such an arrangement can dispatch high speed material data streams but middle sampling of data may not be possible when using signals derived from the control signals.

In another arrangement, a transmission gate based dispatcher arrangement can be provided. A transmission gate type dispatcher has a transmission gate for each channel. Bit switching is done by the transmission gates. A 1:n dispatcher has n transmission gates having a shared input. The output of each transmission gate produces the signals of one channel. Baud rate counter incrementing is used. Such an arrangement may have a disadvantage that it has a high load input load that increases with n and therefore an amplifier may be required. A relatively large number of control signals are required which require the using of an m to n decoder to reduce the number of these signals.

SUMMARY

According to one embodiment, there is provided an arrangement comprising: an input configured to receive data; and at least one multiplexer configured to receive a first logic level at a first input and a second logic level at a second level, at least a part of said data being received at a control input of said multiplexer.

The first logic level may be a high level and the second logic level may be a low level.

The first logic level may be provided by a voltage supply source.

The second logic level may be provided by ground.

The multiplexer may be configured to provide an output which is the same as said at least a part of said data being received as said control input.

A plurality of the multiplexers may be provided, said data comprising a plurality of data streams, a respective one of said plurality of data streams being provided to a respective control input of a respective multiplexer.

A first demultiplexer may be configured to receive said data and output a plurality of divided data outputs.

A plurality of further demultiplexers may be provided, each of said further multiplexers being configured to divide a respective one of said divided data outputs into a plurality of further divided data outputs.

The or each control input may be configured to receive one of said divided data outputs.

At least one of said demultiplexers may be configured to receive at a control input a clock signal.

The first demultiplexer may be configured to receive at its control input a clock signal having a greater frequency than the clock signal received at the respective control input of said further demultiplexers.

The clock signals received by said further demultiplexers may have the same frequency and different phase.

At least one multiplexer and/or demultiplexer may comprise at least one transmission gate.

The multiplexer may comprise a plurality of transmission gates, each transmission gate receiving said at least a part of said data such that one of said transmission gates is controlled at a time to provide an output of said multiplexer.

The demultiplexer may comprise a plurality of transmission gates, each transmission gate receiving said at least a part of said data such that one of said transmission gates is controlled at a time to provide an output of said multiplexer.

According to another embodiment, there is provided a deserializer comprising: an arrangement as discussed above; and a plurality of deserializing stages configured to receive data from said arrangement in serial form and output said data in parallel form.

Each of said deserializing stages may comprise a plurality of flip flops arranged in series.

A controller may be configured to cause said data to be clocked through said flip flops until data is in each of said flip flops and to cause said data to be output in parallel by said respective flip flops.

The data may comprise a stop bit, said controller being configured to use said stop bit to determine when said data is ready to be output in parallel.

The controller may be configured to reset said flip flops when said data has been output.

BRIEF DESCRIPTION OF THE DRAWINGS

For a better understanding of some embodiments, reference will now be made by way of example only to the accompanying drawings in which.

DETAILED DESCRIPTION OF THE DRAWINGS

Figure 9:
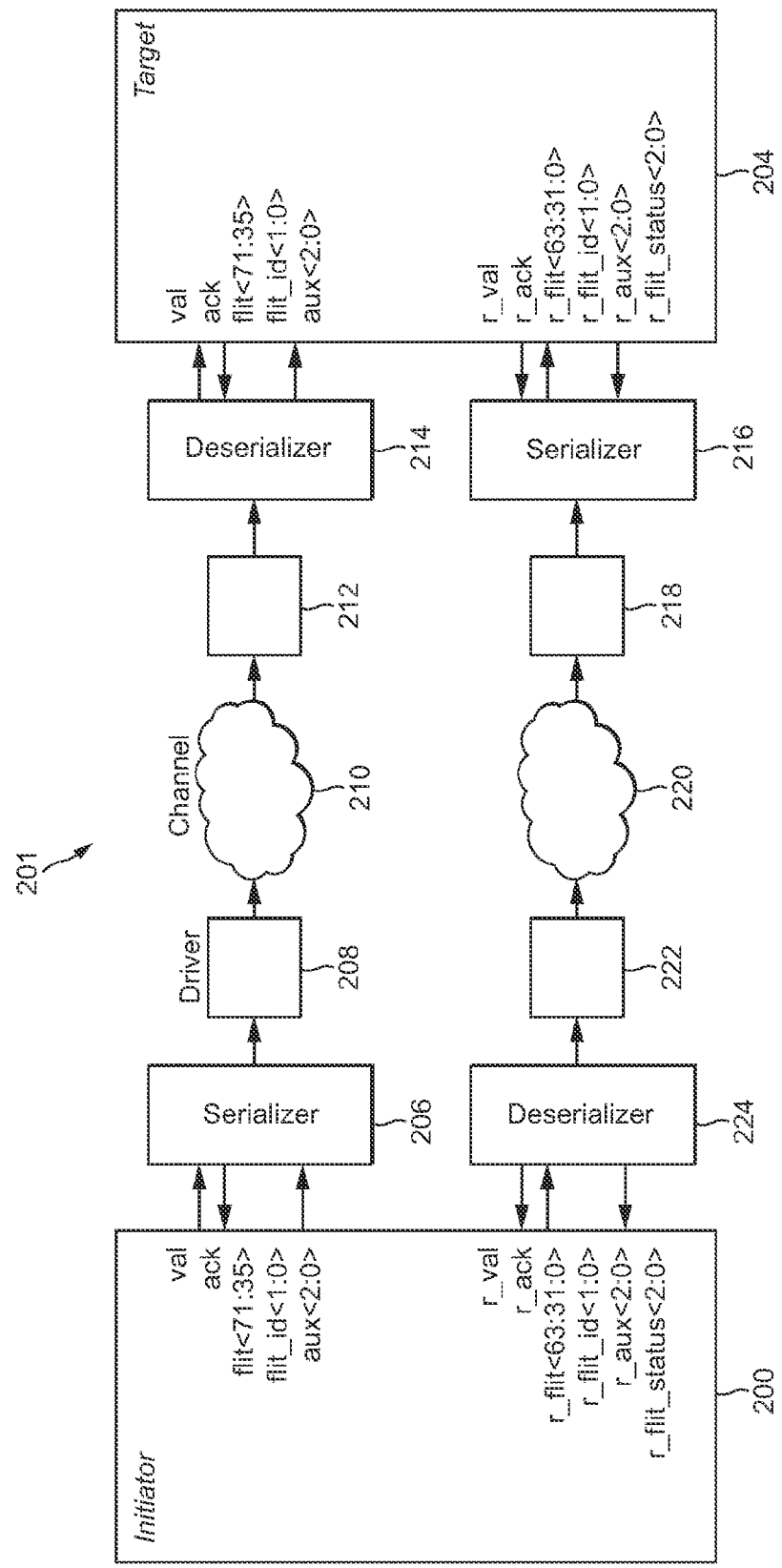
FIG. 9 schematically shows an integrated circuit.

Reference is made to FIG. 9 which schematically shows an integrated circuit 201 in which embodiments may be incorporated. The integrated circuit 201 has an initiator 200 which is arranged to communicate with a target 204. The initiator 200 will typically issue requests which are sent to the target 204 and the target 204 will typically respond to the requests. The responses are typically sent back to the initiator 200.

It should be appreciated that in practice, more than one initiator 200 may be provided and/or more than one target 204 may be provided. It should also be appreciated that a given initiator may be a target. Additionally or alternatively, a given target may also be an initiator.

The requests output by the initiator 200 are output in a parallel format to a first serializer 206 which converts the parallel format request into a serial form. The serialized data is output to a first driver 208 which puts the data onto a first channel 210. The output end of the first channel is input to a second driver 212. The output of the second driver is input to a first deserializer 214. The deserializer 214 processes the received serial stream back into the parallel format. The requests, in the parallel format, are output to the target 204.

A similar path is provided for the responses to the request. The responses output by the target 204 are output in a parallel format to a second serializer 216 which converts the parallel format response into a serial form. The serialized data is output to a third driver 218 which puts the data onto a second channel 220. The output end of the second channel is input to a fourth driver 222. The output of the fourth driver is input to a second deserializer 224. The second deserializer 224 processes the received serial stream back into the parallel format. The responses, in the parallel format, are output to the initiator 200.

It should be appreciated that any suitable connection or coupling can be used for the channels 210 and 220. The channels may be provided by a wires, for example metal wires, optical interconnects or any other suitable connection environment or combination of two or more connection environments.

The request and the responses to the requests may comprise data, addressing information, control signals and/or instructions. At least part of the request and response may be in packet form. In other embodiments the data can be in any other suitable format. A signaling protocol may be used in some embodiments. For example, in one embodiment, a node sending data may send a valid signal and a node receiving data may send an associated acknowledgement signal. It should be appreciated that no protocol may be used and/or any other signaling protocol may be used in other embodiments.

In some embodiments the data is sent once the valid signal is high and the acknowledgement is confirmation of receipt of the data by the recipient. This valid/acknowledgement protocol may be used between the initiator and the first serializer 206/second deserializer 224 and between the target and the first deserializer 214/second serializer 216.

Figure 10:
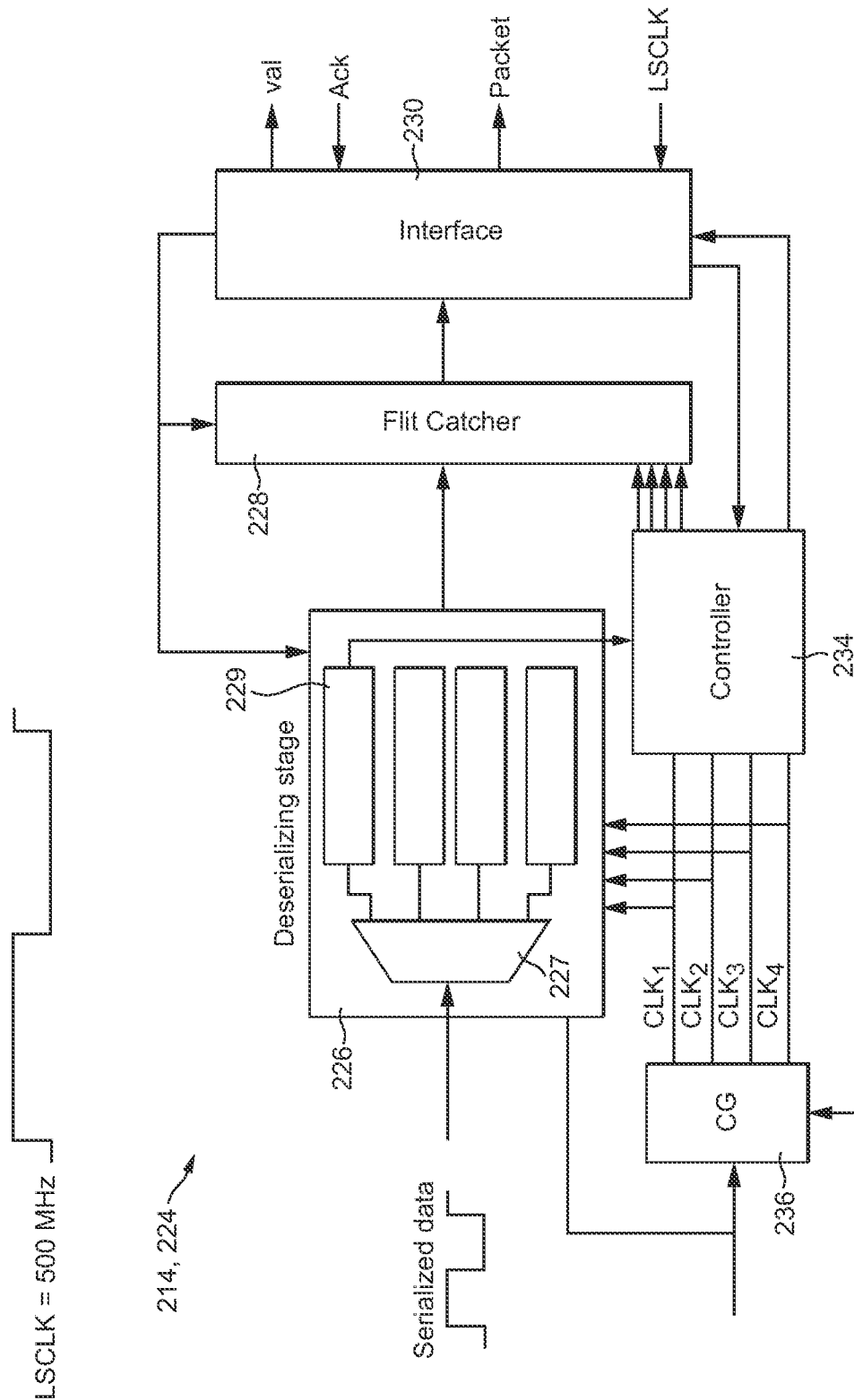
FIG. 10 shows the deserializer of FIG. 9 in more detail.

Reference is made to FIG. 10 which shows the deserializer 214 or 224 in more detail. The serialized data is received by a deserializing stage 226. The deserializing stage has a demultiplexing arrangement 227 which divides the serialized data into the constituent channels which are deserialized by the registers 229. The output of the deserializing stage, in parallel format is loaded by a data catcher 228 which may comprise a register or the like. The registers 229 are successively output into the data catcher which acts as a data buffer.

The output of the data catcher 228 is transferred to an interface 230 which will output the data in packet form. The interface 230 is also configured to implement the valid/acknowledgement protocol, generating the valid signal and receiving the acknowledgement signal. The interface receives a clock signal LSCLK which can be at any suitable frequency. By way of example only, the LSCLK may be at 500 MHz.

A four phase clock generator 236 is provided. The clock generator receives the output of a phase locked loop and generates four clock signals CLK1, CLK2, CLK3, and CLK4. The four clock signals have the same frequency but different phases. The four outputs of the clock generator 236 are input to the deserializing stage 226 and a controller 234. The controller receives an output from the deserializing stage 229 indicating when the data in the registers is ready for output and an output from the interface 230.

The controller provides the four control signals to the data catcher 228 and provides a control output to the interface. The deserializing stage 226 also receives the output of the phase locked loop.

Figure 11:
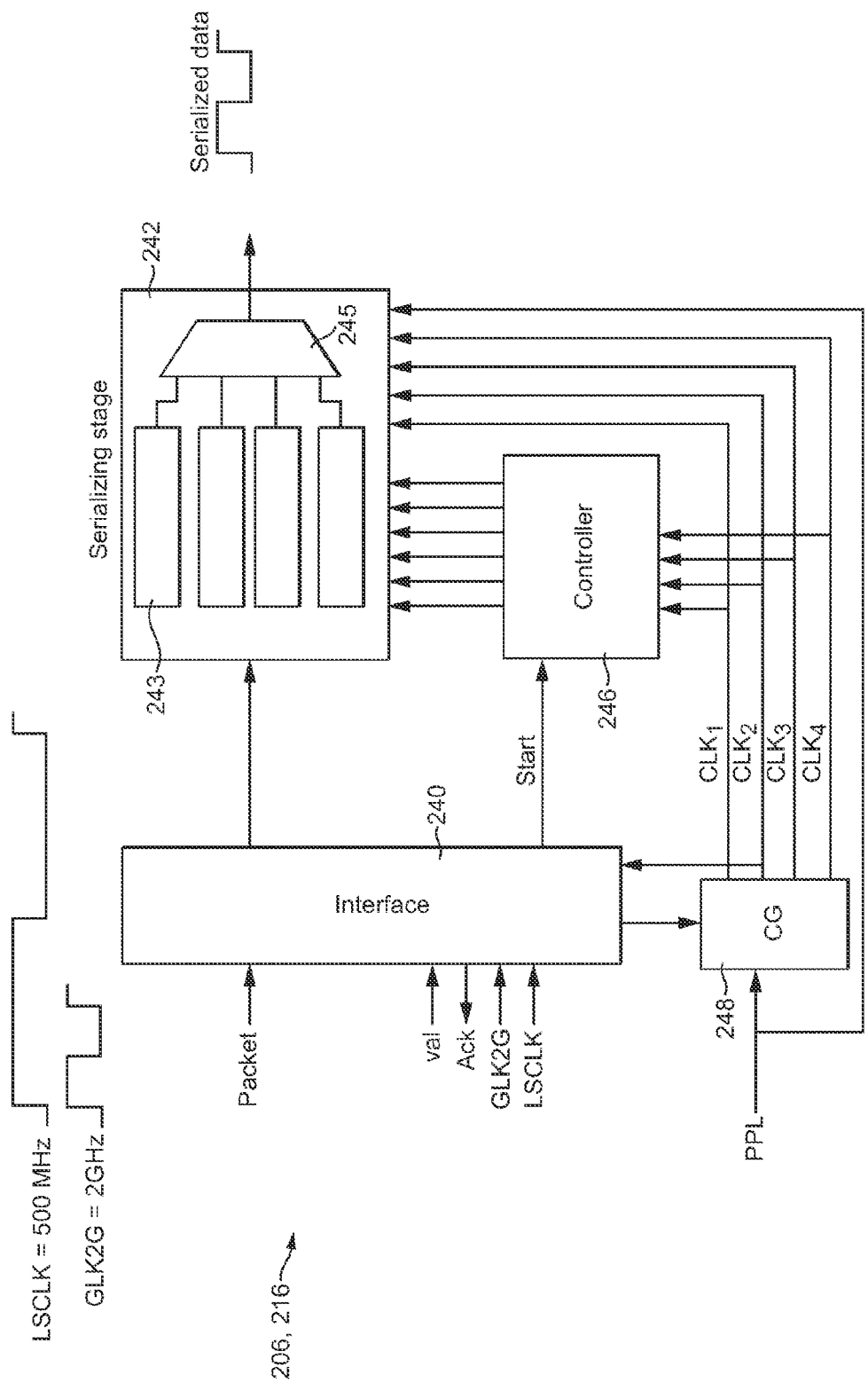
FIG. 11 shows the serializer of FIG. 9 in more detail.

Reference is made to FIG. 11 which shows the serializer 206 or 216 in more detail. The data in parallel format is received by an interface 240. The interface 240 is also configured to implement the valid/acknowledgement protocol, generating the acknowledgment signal in response to receiving the valid signal. The interface receives a clock signal LSCLK which can be at any suitable frequency. By way of example only, the LSCLK may be at 500 MHz. The interface 240 receives a further clock signal CLK2G which can be any suitable value and in example is 2 GHz.

The data in parallel format is output by the interface 240 to a serializing stage 242. The serializing stage 242 is a quad parallel in serial out shift register, inside which each register loads a quarter of the data and serializes that data. The registers outputs then four lower speed serial data. The registers 243 are each connected or coupled to a respective input of a multiplexing arrangement 245 which mixes the constituent channels into a high speed serialized data stream.

A four phase clock generator 248 is provided. The clock generator receives the output of a phase locked loop and generates four clock signals CLK1, CLK2, CLK3, and CLK4. The four clock signals have the same frequency but different phases. In particular, the four clock signals have 90 degrees phase shift. Thus the first clock signal has no phase shift, the second clock signal has 180 degree phase shift, the third clock signal has 90 degree phase shift and the fourth has a 270 degree phase shift. The four outputs of the clock generator 248 are input to the serializing stage 242 and a controller 246. The clock generator receives an enable output from the interface 240. The controller provides the four clock signals to the serializing stage 242 and receives a start signal from the interface 240.

Figure 1:
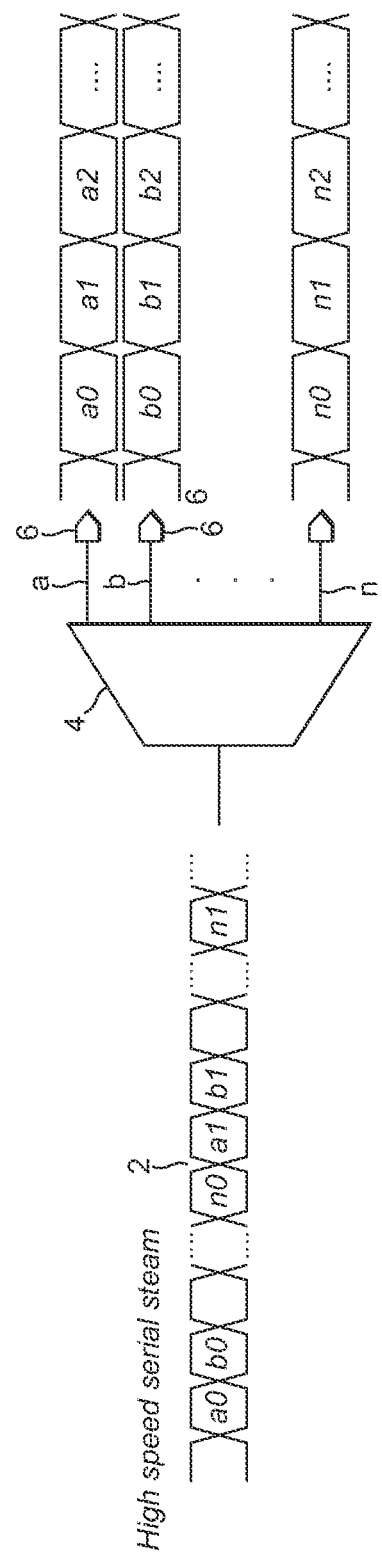
FIG. 1 schematically shows dispatching of a high speed serial stream.

Reference is made to FIG. 1 which schematically illustrates a received high speed serial stream 2. The serial stream 2 comprises data from n different channels. The data is represented by the notation kc where k is the channel from a to n and c is the data bit order. The reference c is an integer starting from 0. As can be seen the serial stream 2 is input to a demultiplexing arrangement 4 which provides n outputs 6. The data provided on each output 6 corresponds to the data on a respective channel.

Figure 2:
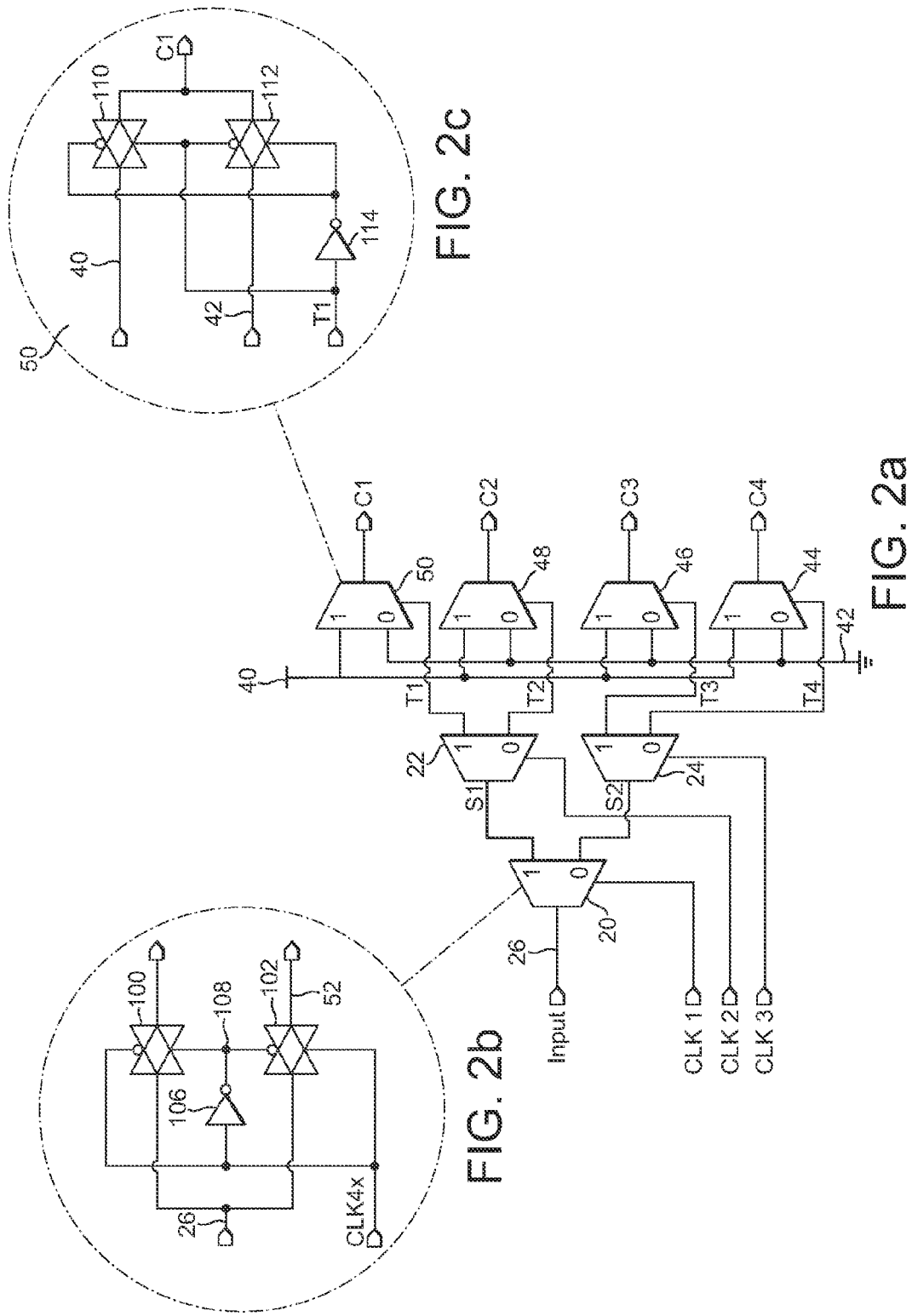
FIGS. 2a to 2c show a dispatcher according to an embodiment.

FIG. 2a shows an arrangement of one embodiment. It should be appreciated that this may be the demultiplexing arrangement 227 of FIGS. 6 and 10. In the example shown in FIG. 2a, n=4. However, it should be appreciated that this is by way of example and the design can be used where n is greater than or less than 4. In the arrangement provided, a first 1:2 demultiplexer 20 is provided which is arranged to receive the input serial stream 26. The first demultiplexer is arranged to receive a first clock input CLK1 as its control input. The first output S1 of the first demultiplexer 20 is input to a second 1:2 demultiplexer 22. Likewise, the second output S2 of the first demultiplexer is input to a third 1:2 demultiplexer 24. The second demultiplexer 22 receives a control input from the second clock signal CLK2. The third demultiplexer 24 receives a control input from the third clock signal CLK3. The first demultiplexer 20 functions to divide the serial stream in two. Half of the serial stream goes to the second demultiplexer 22 whilst the other half goes to the third demultiplexer 24.

Reference is made to FIG. 2b which shows the structure of one of 1:2 de-multiplexers of FIG. 2a. Each demultiplexer has a first transmission gate 100 and a second transmission gate 102. The input 26 is arranged to be input to each of the transmission gates. The output of each transmission gate provides the respective outputs S1 and S2. The control input CLKx (where x is 1, 2 or 3) is arranged to be the input to the gate of the NMOS transistor of the second transmission gate 102 and the gate of the PMOS transistor of the first transmission gate 100. The gates of the NMOS transistor of the first transmission gate 100 is connected or coupled to the gate of the PMOS transistor of the second transmission gate 102. An inverter 106 is connected or coupled between the clock signal CLKx and a node 108 arranged between the gate of the NMOS transistor of the first transmission gate 100 and the gate of the PMOS transistor of the second transmission gate 102. This arrangement means that either the first transmission gate 100 passes the input to its output or the second transmission gate 102 passes the input to its output S2. In this way, the input data stream can be divided into two. It should be appreciated that the first, second and/or third demultiplexers may have the structure shown in FIG. 2b.

The demultiplexer thus behaves as a couple of D-latches sharing the same input where the first latch is an active high D-latch and the second is active low D-latch. Both latches are controlled by the same CLKx select signals such that when CLKx is high the first output becomes transparent and the second output become opaque. When the CLKx is low, the output of the first latch became opaque and the output of the second latch become transparent. The latches operate alternatively and at each moment only one output is transparent.

Going back to FIG. 2a, the second demultiplexer 22 provides a first output T1 and a second output T2. The third demultiplexer 24 provides a third output T3 and a fourth output T4. Each of these outputs T1 to T4, represent the data on a respective channel. Each of these outputs T1-T4 is connected or coupled to the control input of a respective multiplexer. Accordingly, the output T1 from the second demultiplexer 22 is provided to the control input of a first multiplexer 50. The second output T2 of the second demultiplexer 22 is provided to the control input of a second multiplexer 48. The first output T3 of the third demultiplexer 24 is input to the control input of the third multiplexer 46. Finally, the second output T4 of the third demultiplexer 24 is input to the control input of the fourth multiplexer 44. Each of the multiplexers 50, 48, 46 and 44 has a first input connected or coupled to a voltage 40. That voltage may, for example, be VDD or a "1" level logic. The other input of the multiplexers 50, 48, 46 and 44 are all coupled to ground 42 or a "0" logic. If the value of the control input is 1, then the "1" input is passed to the output. If, on the other hand, the control input has a value 0, then the "0" is passed to its output. An advantage of this technique is to make the multiplexers output a strong 0 or 1 logic depending on the values of the control signals T1, T2, T3 and T4.

It should be appreciated that the output of each of the multiplexers represents one of the channels and is represented by C1, C2, C3 and C4. As the values of the data output by the demultiplexers are used as control signals instead of the channel values themselves, the need for amplification is removed.

Reference is made to FIG. 2c which shows the structure of the multiplexers of FIG. 2a in more detail. For reference purposes, the structure of the first multiplexer 50 is shown. The same structure can be used for any other multiplexers. The multiplexer 50 comprises a first transmission gate 110 and a second transmission gate 112. The first transmission gate 110 is connected or coupled to the voltage supply 40.

The second transmission gate 112 has its input connected or coupled to ground 42. The outputs of each of the first and second transmission gates 110 and 112 are connected or coupled to provide the C1 channel. The gate of the PMOS transistor of the first transmission gate 110 along with the gate of the NMOS transistor of the second transmission gate 112 is connected or coupled to the output of an inverter 114. The input to the inverter 114 is the output T1 received from the second de-multiplexer 22. The output T1 is also provided to the gate of the NMOS transistor of the first transmission gate 110 and the gate of the PMOS transistor of the second transmission gate 112. If T1 is 1 or high, then the input on the first transmission gate is passed to the output, i.e. 1. If on the other hand, T1 is 0, then the input, i.e. ground 42 on the second transmission gate 112 is passed to the output C1.

It should be appreciated that where n is more than four, the number of demultiplexers and/or demultiplexing stages increase such that the n channels can be separated.

Figure 3:
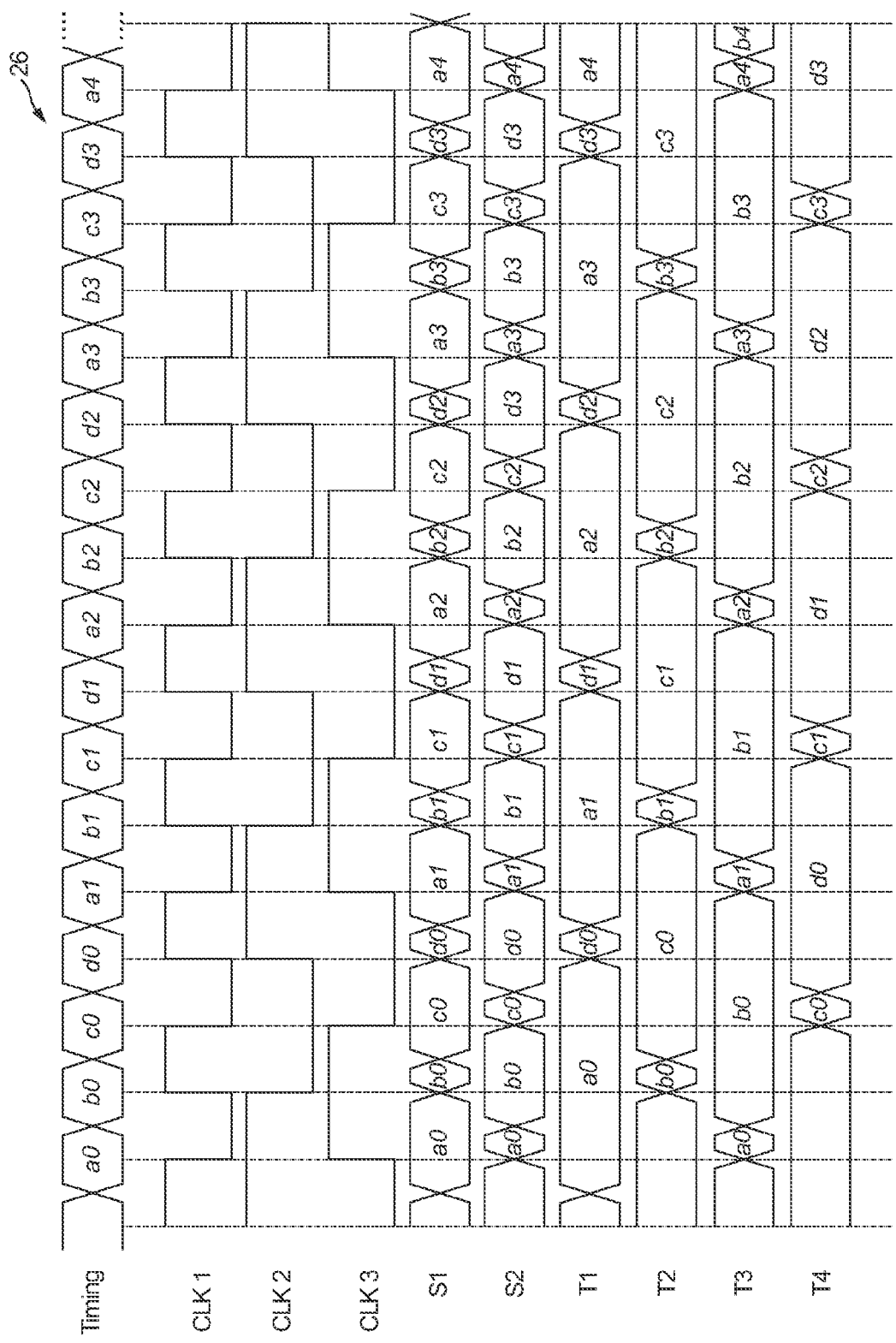
FIG. 3 shows a timing diagram for the arrangement of FIGS. 2a-2c.

Reference is made to FIG. 3 which shows a timing diagram for the arrangement of FIG. 2a.

The first line shows the input data 26. As can be seen, the data for each of the channels is provided in the serial form. In the example shown in FIG. 3, data 0 for channel A is first provided followed by data 0 for channel B, data 0 for channel C and data 0 for channel D. That is then followed by data 1 for channel A, data 1 for channel B and so on.

The second line shows the first clock signal CLK1. The first clock signal frequency is half the data frequency of the input channel. For middle sampling of the incoming data, CLK1 is delayed such that clock transitions happen at midway the bit pulse.

The third line shows the second clock signal. The second clock signal CLK2 has half the frequency of the first clock signal and its rise event occurs at the same time when CLK1 rises. The third clock signal CLK3 is shown on the fourth line and again has half the frequency of the first clock signal. However, the second and third clock signals are shifted by 90 degrees. The fifth line shows the S1 output of the first demultiplexer whilst the sixth line shows the S2 output of that first demultiplexer. When the clock signal CLK 1 is high (i.e. "1"), the first demultiplexer passes the associated received data to the output as the S1 output. The output S1 become opaque and holds the value of the input signal when CLK 1 goes to low state. This means that in the example shown in FIG. 3, the S1 output provides the a0 data until there is a rising edge on the clock signal. At that time the b0 data is provided but that data changes shortly after the clock signal has gone high, but still while the clock signal is high. The S1 output then provides the c0 data. The clock signal goes low but the c0 data continues to be provided as the output until the clock signal again goes high. At that point the d0 data is provided but that data changes shortly after the clock signal has gone high but still while the clock signal is high. The S1 output then provides the a1 data and so on. As can be seen the S1 data is primarily the data from the A and C channels. If Pw is considered as the pulse width of a bit provided by the input, S1 outputs ai and ci during a period are equal to 1.5 Pw while bi and di are maintained during only 0.5 Pw.

When the clock signal CLK 1 is low (i.e. "0"), the first demultiplexer will pass the associated received data to the output as the S2 output. The output S2 becomes opaque and holds the value of the input signal when CLK 1 goes to the high state. This means that in the example shown in FIG. 3, the S2 output provides the a0 data. That data changes shortly after the clock signal has gone low, but still while the clock signal is low. The S2 output then provides the b0 data. The clock signal goes high but the b0 data is held until the clock signal again goes low. At that point the c0 data is provided but that data changes shortly after the clock signal has gone low but still while the clock signal is low. The S2 output then provides the d0 data and so on. As can be seen the S2 data is primarily the data from the B and D channels. S2 outputs bi and di are maintained during a period equal to 1.5 Pw while ai and ci are maintained during only a period of 0.5 Pw.

The seventh, eighth, ninth and tenth lines respectively show the T1, T2, T3 and T4 outputs of the second and third demultiplexers 22 and 24. The T1 output copies the S1 signal when the second clock signal is high and maintains that signal when the clock becomes low. As a result, T1 provides alternatively the bits of the channel a with a pulse width equal to 3.5 Pw and the bits of the channel d with a 0.5 Pw pulse width. Thus the T1 signal primarily comprises the A channel data. Similarly, the T2 output comprises the value of the S1 signal when the second clock signal is low. Thus the T2 signal primarily comprises the C channel data. The T3 output comprises the value of the S2 signal when the third clock signal is high. Thus the T3 signal primarily comprises the B channel data. The T4 output comprises the value of the S2 signal when the third clock signal is low. Thus the T4 signal primarily comprises the D channel data. It should be appreciated that the relationship between the input signal S and the output signal T is analogous to the relationship between the input data 26 and the output signal previously described.

The Ci outputs have the similar timing as the T1 signals however they are stronger. Thus, the direct sampling of the Ci signals with the flip-flop 120 of the deserializing stage of the FIG. 4 became possible. The unwanted 0.5 Pw data provided by the Ci output do not affect the effectiveness of the circuits. In fact the sampling concerns only the 3.5 Pw bits that are wide enough to be faithful to the hold and setup timing constraints. The middle sampling can be performed by using CLK2, CLK3, $\overline{CLK2}$ and $\overline{CLK3}$ signals to clock the different deserializing stages.

When the frequencies of the CLKx clocks signal are relatively high, the 0.5 Pw bits seen on Ci outputs may result in glitches. These glitches may be filtered thanks to the inertial delays of the multiplexers/demultiplexers. Thus, Ci may output the original channels and the pulse width of each bit becomes equal to 4 Pw.

The utilization of transmission gate based multiplexers/demultiplexers may have advantages. Some embodiments may provide an arrangement where there is high jitter tolerance. There may be relatively low power consumption. There may be a relatively small amount of delay introduced to the data path. The area required on the integrated circuit may be relatively small. The demultiplexers may be transmission gate based and form a tree. The Boolean signals at level i are clocks operating at $F/2^i$ and are delayed from each other by $2\pi/m$ to generate an incremental code when they change.

Some embodiments are able to dispatch a high speed serial data stream. The input/output buffer can be omitted. Embodiments may be used with small transistor sizes. In some embodiments, the dispatched data controls the multiplexer to strengthen itself. Thus the output may be easily read by a flip-flop. The area required may be relatively small:

$$\approx Area_{Mux} \times n + Area_{Demux} \times \sum_{i=0}^{m-1} 2^i$$

Some embodiments may be relatively easy to implement. Sampling of signals can be done in the middle of the data, for example as shown in FIG. 3.

Figure 4:
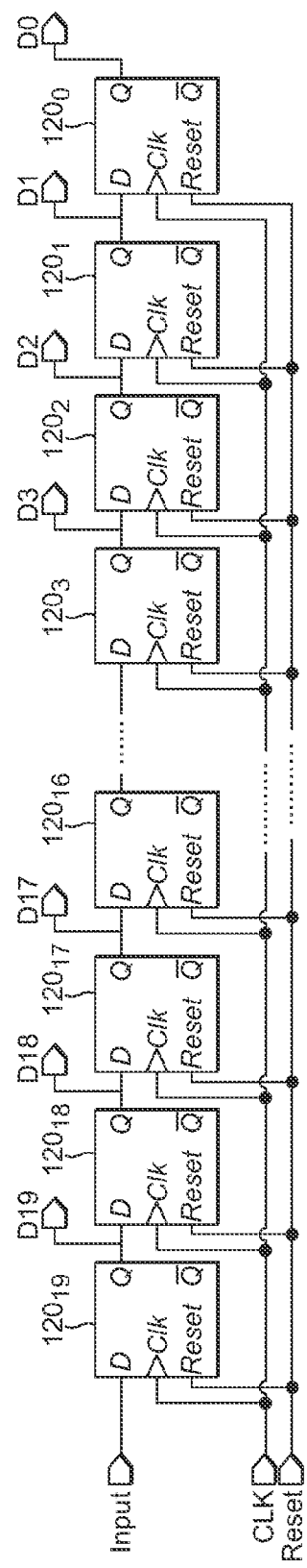
FIG. 4 shows a one stage deserializer.
Figure 6:
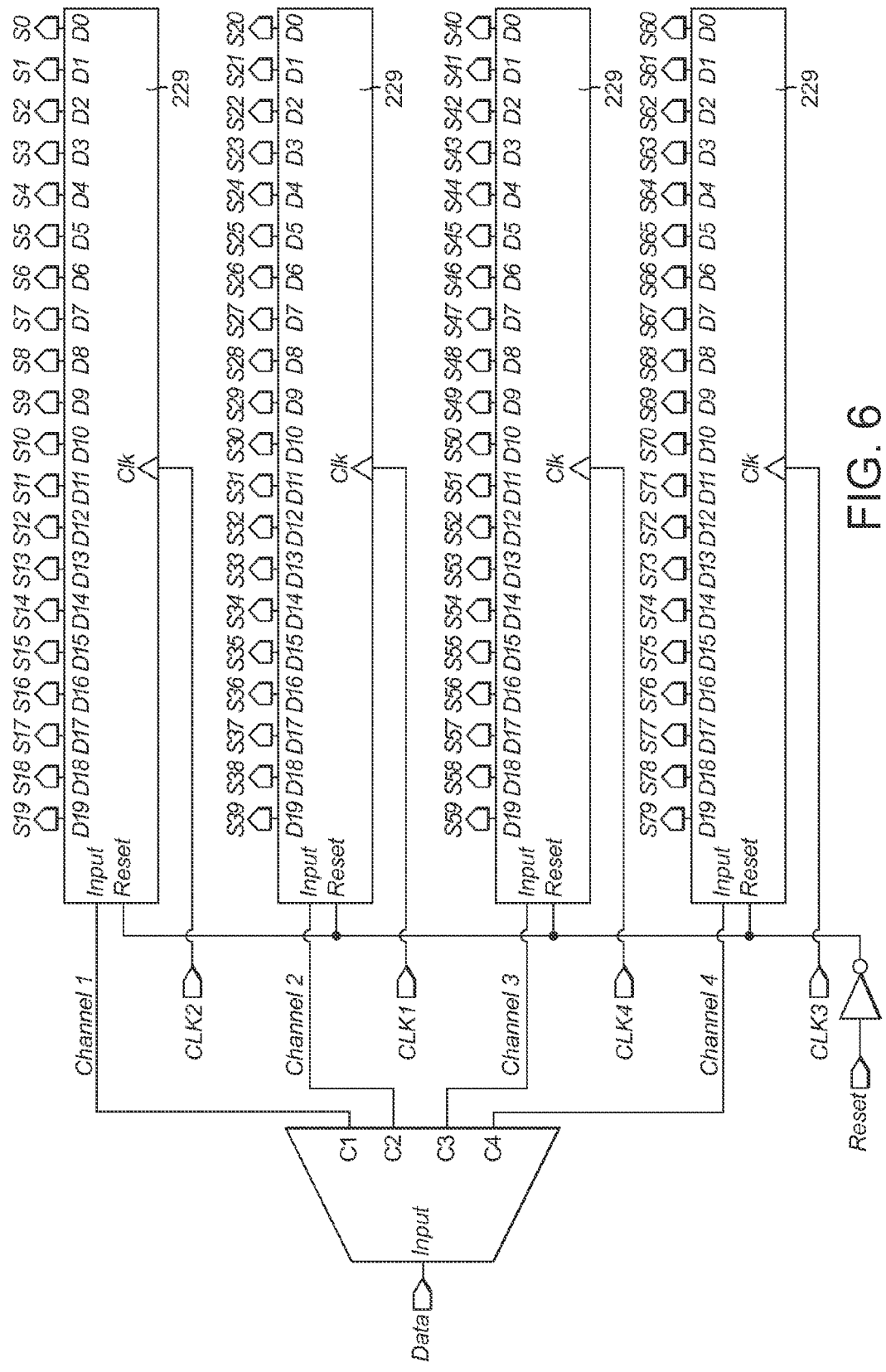
FIG. 6 shows a four stage deserializer.

Reference is now made by way of example only to FIG. 4 which shows in more detail one of the registers 229 of the deserializing stage of FIG. 6. In the arrangement shown in FIG. 4, the deserializing stage comprises flip-flops $120_n$. In the example shown there are 20 flip flops $120_0$ to $120_{19}$. Each of the flip flops is arranged to receive a clock signal CLK at its clock input. The first flip flop $120_{19}$ is arranged to receive one of the channels as an input to sample the data and may be coupled or connected to the output of one of the demultiplexers shown in FIG. 2a. The Q output of each flip flop (apart from the last flip flop) is configured to be input to the D input of the succeeding flip flop. Additionally the Q output of each flip flop is configured to provide one bit of the parallel output provided by the register 229. Each flip flop 120 is configured to receive a reset signal at its reset input, when the flip flops have to be reset.

Figure 5:
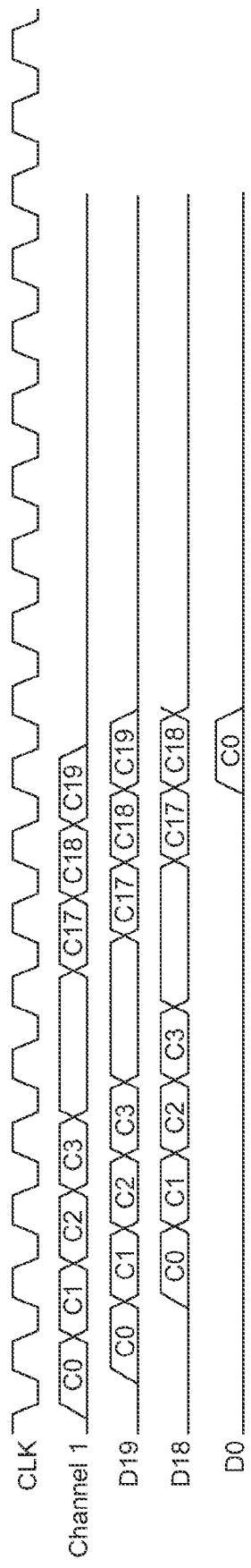
FIG. 5 shows the timing associated with the deserializer of FIG. 4.

Reference is now made to FIG. 5 which shows a timing diagram. The first line shows the clock signal. The second line shows the data on a given channel which comprises 20 bits C0-C20. The first bit C0 is a stop bit and will be identified as such. The third line shows the data output for the first flip flop $120_{19}$, the fourth line shows the data for the second flip flop $120_{18}$ while the last line shows the output of the last flip flop $120_0$.

As can be seen, on each clock cycle, the data is pushed through the chain of flip flops until the first data c0 is at the output of the last flip flop $120_0$, the nineteenth data C18 is at the second flip flop $120_{18}$ and the last data C19 is at the first flip flop $120_{19}$. The serial data input into the register can thus be output in parallel to deserialize the data. Reference is now made to FIG. 6 which shows a four stage deserializer. Each stage of the deserializer comprises a register as shown in FIG. 4. It should be appreciated that a different channel is input to a respectively different register. It should also be appreciated that a different one of the registers receive a different one of the clock signals generated by the four phase clock generator 236 (See FIG. 10). The clock generator receives the output of a phase locked loop and generates four clock signals CLK1, CLK2, CLK3, and CLK4. The four clock signals have the same frequency but different phases. A respective one of these clock signals is used by respective ones of said registers.

The first bit of the first channel is a stop bit. The data is pushed progressively into the registers until the stop bit is received at the last flip flop of the first register. In practice the last bit of each of the second, third and fourth registers will sampled after that stop bit has reached the end of the first register. All of the data in the four registers is then read out in parallel, generally one after another. There may be some overlap between for example a last bit being clocked into a register and a full register outputting its data in parallel. Alternatively all the registers are filled up and only then is the data output from the registers.

When the data is read out, a reset is applied to each of the registers to reset all the flip flops of the shift registers.

The stop bit may have the value 1 or any other suitable value. The stop bit may in some embodiments be stop bits. In some embodiments, a stop bit or bits may be provided on more than one channel.

Figure 7:
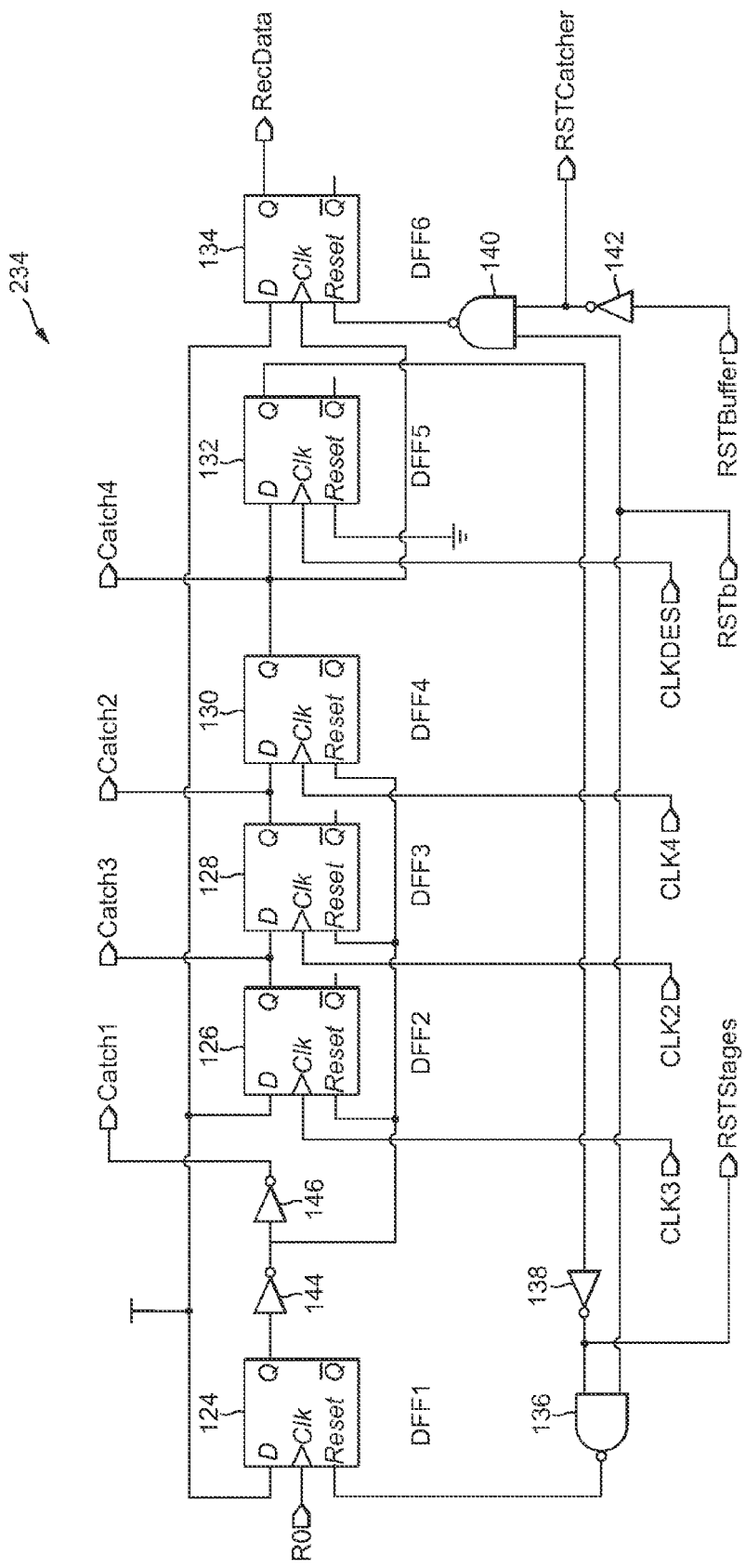
FIG. 7 shows a controller of the deserializer.

Reference is made to FIG. 7 which shows controller 234 of FIG. 10 in more detail. The controller 234 has six flip flops 124 to 134. The first flip flop 124 receives an R0 input which is provided when the stop bit has been received at the last flip flop of the first register as the clock signal input. Thus the R0 signal indicates to the controller that the stop bit was received and that it can begin producing control signals to the data catcher register, communicate by handshaking to pass the constructed parallel data to the interface and finally initialize the deserializer.

The D input of each of the first, second and sixth flip flops is tied to a predetermined voltage level corresponding to 1. The first flip flop receives a reset signal from the output of first NAND gate 136. The first NAND gate has a first input received from a reset input of the controller. This is a general reset signal which is used to reset the whole deserializer. The first NAND gate has a second input from a first inverter 138, the input of which receives the Q output of the fifth flip flop 132. The Q output of the first flip flop input to a second inverter 144, the output of which provides a reset input to the second, third and fourth flip flops 126, 128, 130. The output of the second inverter 144 is input to a third inverter 146, the output of which provides a catch signal which indicates to the data catcher 228 that the first register is outputting the data. This makes the first register of the data catcher load the first quarter of the data. The data catcher 228 is composed of four registers, each one being used to hold the data available at the output of the shift registers 229. Since the deserializer shifts continuously the received data through the shift register at each clock cycle, the data has to be loaded immediately and separately at each register after the stop bit has reached the end of the first deserializing stage. Given that the serializing stages are clocked with different clocks the controller has to generate four control signals to the catcher such that the sampling of each quarter of the data is done in the middle of the pulse width. The control signals are used as clock signals for the different register of the data catcher.

The second flip flop 126 receives the third clock signal CLK3 as the clock input and provides a catch signal on its Q output to make the third register of the data catcher load the third quarter of the data.

The third flip flop 128 receives the second clock signal CLK2 as the clock input and provides a catch signal on its Q output to make the second register of the data catcher load the second quarter of the data. The third flip flop 128 receives the Q output of the second flip flop 126 as its D input.

The fourth flip flop 130 receives the fourth clock signal CLK4 as the clock input and provides a catch signal on its Q output to make the fourth register of the data catcher load the last quarter of the data. The fourth flip flop 130 receives the Q output of the third flip flop 128 as its D input.

The fifth flip flop 132 has its reset input coupled or connected to ground, its D input coupled or connected to the Q output of the fourth flip flop 130. The clock input receives a clock signal CLKDES which is an inverted version of the PLL clock signal. This signal is to delay the automatic self reset of the control signals by half a PLL period. This helps to extend the pulse width of the signal generated on the Q output of the flip flop 130 to guarantee a sufficient hold time when used to trigger the fourth register of the data catcher.

The sixth flip flop 134 receives the Q output of the fourth flip flop 130 as its clock signal. The reset input receives the output of a second NAND gate 140. The NAND gate receives a first input from a fourth inverter 142, the input of which is a RST buffer signal which comes from the interface. The second input of the second NAND gate 140 receives the reset signal which is the general reset signal. The output of the fourth inverter also provides a reset signal for the data catcher 228.

Figure 8A:
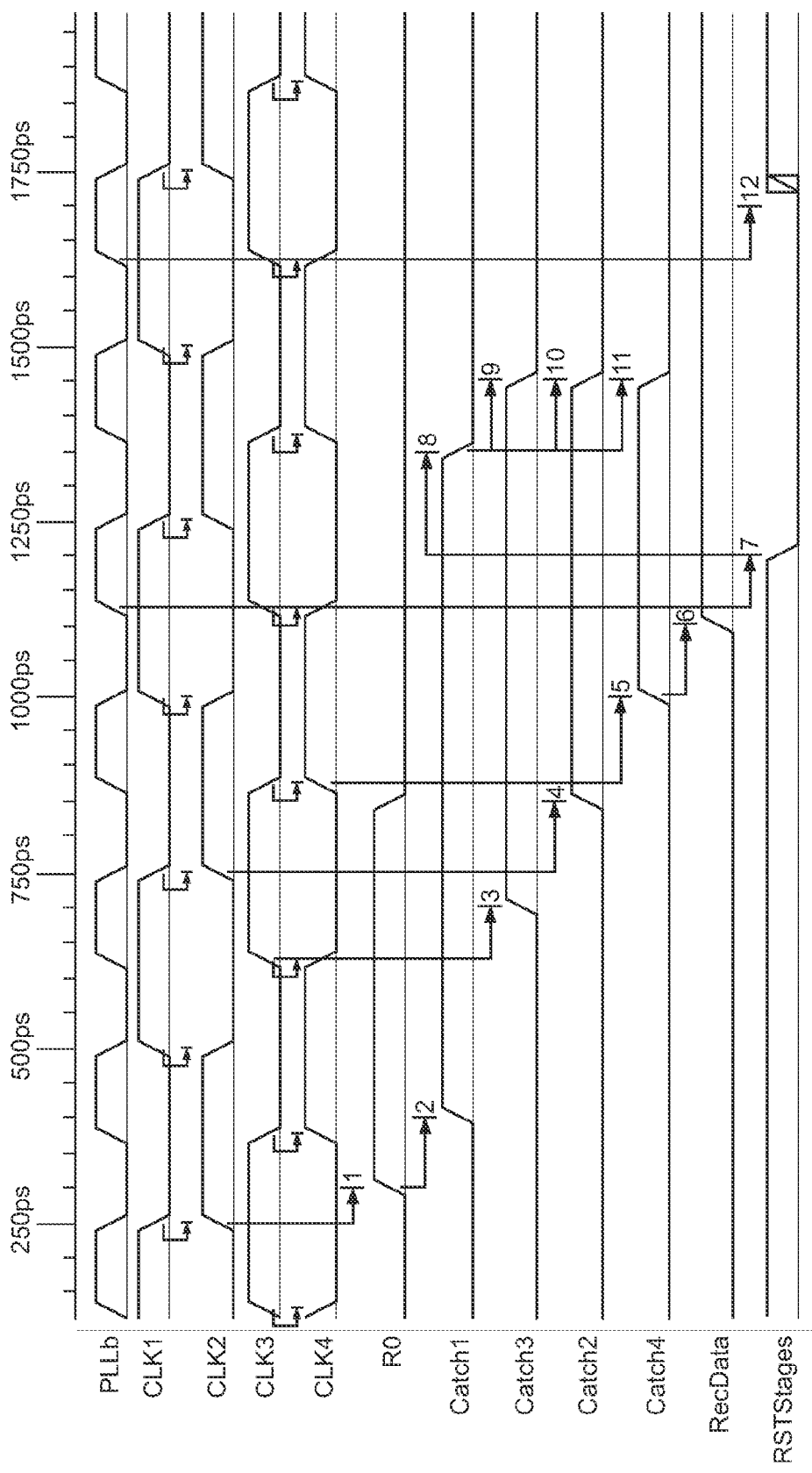
FIG. 8a shows the controller while controlling the four stages deserializer.

Reference is made to FIG. 8a which shows a timing diagram. Line 1 shows the phase lock loop signal PLL which is used by the clock generator 236 to generate the four clock signals CLK1, CLK2, CLK3, and CLK4. The four clock signals have the same frequency but different phases. These clock signals are respectively shown on lines 2 to 5 for the timing diagram of FIG. 8a.

Line 6 of the timing diagram shows the R0 input received by the first flip flop. Lines 7 to 10 respectively show the first, third, second and fourth catch signals. The eleventh line shows the RecData output of the Q output of the sixth flip flop and the final line shows the RST Stages signal output by the first inverter 138.

When the stop bit has been received, the R0 signal goes high after the next rising edge of the first clock signal CLK1. The first catch signal Catch 1 will then go high. In this way the first quarter of the data is stored in the data catcher.

The first rising edge of the third clock signal CLK3, after the R0 signal goes high, triggers the third catch signal catch 3.

The first rising edge of the second clock signal CLK2, after the R0 signal goes high, triggers the second catch signal catch 2. The next rising edge of the fourth clock signal CLK4, after the R0 signal goes high, triggers the fourth catch signal catch 4. When this is done the fourth part of the data is stored in the data catcher.

The receive data output goes high after the last catch signal catch 4 has been asserted to indicate that the data has been constructed and that it is ready to be transferred to the interface. A reset stages signal is then pulled low which is triggered by the next rising edge of the PLL signal after the deceive data output has gone high. This causes the reset stages signal to go low. This signal is used as a reset signal for the quad stage deserializer. This active low Reset signal resets asynchronously and simultaneously the four deserializing stages forcing at the same time the catch signals catch 2, catch 3 and catch 4 to low state. The flip flops are reset as this causes the output of the NAND gate 136 to go high, thus resetting the first flip-flip forcing the first catch signal to go to the low logic value. The Q output is then low which means the output of inverter 144 which provides the reset signal to the second, third and fourth flip flop, in parallel, is now high. The second to fourth flip flops are thus reset. This means that the respective catch signals provided by the second to fourth flip flops change to the low logic level.

In FIG. 8a, PLLb is than CLKDES. The fifth flip flop copies the catch 4 signal and as consequence it will go to a low state at the rising edge of CLKDES. As consequence the RSTStages signal become high. The first flip flop is activated and all the signals gain their initial states. The controller is ready now for a new cycle of operation.

Figure 8B:
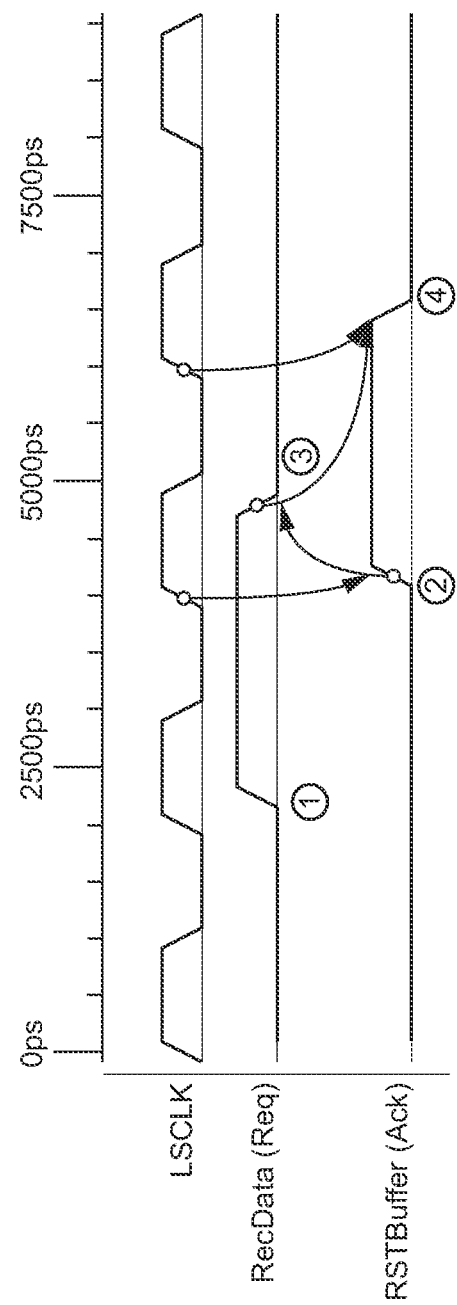
FIG. 8b show the timing of the controller while communicating with the deserializer's interface.

FIG. 8b shows the handshaking signals used between the controller and the deserializer interface to transfer successfully constructed data from the data catcher to the queue of the interface. FIG. 8b shows on the first line the LSCLK signal, the second line shows the receive data signal and the third line show the RSTBuffer signal. When new data is constructed the RecData (or Request) signal becomes high (reference 1 in FIG. 8b). This signal is used as a request signal for the interface. When RecData is high, the rising edge of the LSCLK will result in the loading of the data into the first register of the queue and also causes the rise of the RSTBuffer (or ACK) signal to indicate that the data is successfully loaded (referenced 2 in FIG. 8b). The RSTBuffer signal resets asynchronously the sixth flip flop of the controller which forces the RecData signal to go to the low state (referenced 3 in FIG. 8b). In the next clock cycle, the loaded data is stored in the second register of the queue and the RSTBuffer signal goes to low state (referenced 4 in FIG. 8b). The inverter 146 is used to provide the RSTCatcher signal from the RecData signal. When data is loaded in the first register, the RSTCatcher signal remains high for one LSCLK cycle to reset the Catcher. All the blocks of the deserializer are initialized and a new data deserialization cycle can begin.

The above described circuitry may be provided on an integrated circuit.

The arrangement of embodiments may be used in any suitable scenarios in addition or alternatively to the deserializer.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   demultiplexer circuitry configured to receive data from an input and output a plurality of divided data signals, and
   multiplexer circuitry configured to receive a first logic high level at a first input of said multiplexer circuitry, and receive a second logic low level at a second input of said multiplexer circuitry and receive one of said divided data signals at a control input of said multiplexer circuitry,
   wherein said multiplexer circuitry is operable to select between the first logic level at the first input and the second logic level at the second input for output from the multiplexer in response to the received divided data signal, and
   wherein said multiplexer circuitry comprises a plurality of multiplexers, said divided data signals comprises a plurality of data streams, and a respective one of said plurality of data streams is provided to a respective control input of a respective one of said plurality of multiplexers.

2. The circuit of claim 1 wherein said first logic high level is provided by a voltage supply source.

3. The circuit of claim 2 wherein said second logic low level is provided by ground.

4. The circuit of claim 1, wherein said multiplexer circuitry is configured to provide an output which is the same as the divided data signal received as said control input.

5. The circuit of claim 1, wherein said demultiplexer circuitry comprises a plurality of demultiplexers, each of said demultiplexers configured to divide a received data input into a plurality of divided data signals.

6. The circuit of claim 5, wherein said multiplexer circuitry comprises a plurality of multiplexers each having a control input, the control inputs each receiving one of said divided data signals.

7. The circuit of claim 5, wherein each demultiplexer includes a control input configured to receive a clock signal.

8. The circuit of claim 7, wherein a first demultiplexer receives at its control input a clock signal having a greater frequency than a clock signal received at each of the respective control inputs of second and third demultiplexers, said second and third demultiplexers having inputs receiving the divided data signals of the first demultiplexer.

9. The circuit of claim 8, wherein said clock signals received at each of the second and third demultiplexers have a same frequency with a different phase.

10. The circuit of claim 1, wherein said multiplexer circuitry and demultiplexer circuitry each comprise at least one transmission gate.

11. The circuit of claim 10, wherein said multiplexer circuitry comprises a plurality of transmission gates, each of said plurality of transmission gates receiving at least a part of said divided data signal such that either a first of said plurality transmission gates provides an output of said multiplexer or a second of said plurality of transmission gates provides an output of said multiplexer.

12. The circuit of claim 10, wherein said demultiplexer circuitry comprises a plurality of transmission gates, each of said plurality of transmission gates receiving data such that either a first of said plurality said transmission gates provides an output of said demultiplexer or a second of said plurality of transmission gates provides an output of said demultiplexer.

13. The circuit of claim 1, wherein said data received at the input comprises serialized data, and wherein said multiplexer circuitry comprises a plurality of outputs configured to output said serialized data in parallel form.

14. A circuit, comprising:
a first demultiplexer having an input configured to receive a serialized data stream and a first and second output configured to produce a first and second divided data stream;
a second demultiplexer having an input configured to receive the first divided data stream and a first and second output configured to produce a third and fourth divided data stream;
a third demultiplexer having an input configured to receive the second divided data stream and a first and second output configured to produce a fifth and sixth divided data stream;
a first multiplexer having a control terminal configured to receive the third divided data stream and a output configured to produce a first parallel data bit;
a second multiplexer having a control terminal configured to receive the fourth divided data stream and a output configured to produce a second parallel data bit;
a third multiplexer having a control terminal configured to receive the fifth divided data stream and a output configured to produce a third parallel data bit; and
a fourth multiplexer having a control terminal configured to receive the sixth divided data stream and an output configured to produce a fourth parallel data bit.

15. The circuit of claim 14, wherein the first demultiplexer includes a control terminal configured to receive a first clock signal, the second demultiplexer includes a control terminal configured to receive a second clock signal, and the third demultiplexer includes a control terminal configured to receive a third clock signal.

16. The circuit of claim 15, wherein the first clock signal has a greater frequency than the second and third clock signals.

17. The circuit of claim 15, wherein the second and third clock signals have a same frequency but different phase.

18. The circuit of claim 14, wherein each of the first through fourth multiplexers include a first and second input, said first inputs coupled to receive a first logic state signal and said second inputs coupled to receive a second logic state signal.

19. A circuit, comprising:
demultiplexer circuitry having an input configured to receive a serialized data stream including a plurality of channels and further having a plurality of outputs equal in number to said plurality of channels, each output configured to produce a divided data signal, and
a plurality of multiplexers equal in number to said plurality of channels, each multiplexer having a first input configured to receive a first logic high level signal, a second input configured to receive a second logic low level signal, and a control input configured to receive one of said divided data signals, a plurality of outputs from said plurality of multiplexers configured to output data from said received serialized data stream in a parallel form,
wherein each multiplexer is operable to select between the first logic level signal at the first input and the second logic level signal at the second input for output from the multiplexer in response to the received divided data signal.

20. The circuit of claim 19, wherein said demultiplexer circuitry comprises a plurality of demultiplexers equal in number to said plurality of channels minus 1 coupled in a configuration wherein one of said demultiplexers in said plurality produces divided data signals output to inputs of two subsequent demultiplexers in said plurality.

21. The circuit of claim 20 wherein each of said multiplexers includes a control input configured to receive a clock signal, and wherein the clock signal applied to the control input of said one of said demultiplexers has a frequency greater than the clock signals applied to the control inputs of said two subsequent demultiplexers.

22. The circuit of claim 21, wherein the clock signals applied to the control inputs of said two subsequent demultiplexers have a same frequency but different phase.

* * * * *